(12) United States Patent
Kanemura et al.

(10) Patent No.: US 10,745,531 B2
(45) Date of Patent: Aug. 18, 2020

(54) FILM

(71) Applicant: DAIKIN INDUSTRIES, LTD., Osaka-Shi, Osaka (JP)

(72) Inventors: Takashi Kanemura, Osaka (JP); Eri Mukai, Osaka (JP); Takeshi Hazama, Osaka (JP); Tetsuhiro Kodani, Osaka (JP); Nobuyuki Komatsu, Osaka (JP); Hisako Nakamura, Osaka (JP); Kouji Yokotani, Osaka (JP); Mayuko Tatemichi, Osaka (JP); Akio Higaki, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/742,971

(22) PCT Filed: Jul. 13, 2016

(86) PCT No.: PCT/JP2016/070659
§ 371 (c)(1),
(2) Date: Jan. 9, 2018

(87) PCT Pub. No.: WO2017/014123
PCT Pub. Date: Jan. 26, 2017

(65) Prior Publication Data
US 2018/0223059 A1 Aug. 9, 2018

(30) Foreign Application Priority Data
Jul. 17, 2015 (JP) .................. 2015-143107

(51) Int. Cl.
| | |
|---|---|
| *C08J 5/18* | (2006.01) |
| *H01G 4/18* | (2006.01) |
| *B32B 27/30* | (2006.01) |
| *H01G 4/33* | (2006.01) |
| *H01L 41/193* | (2006.01) |
| *C08F 214/22* | (2006.01) |
| *C08F 214/26* | (2006.01) |
| *H01G 4/32* | (2006.01) |
| *H01L 41/257* | (2013.01) |

(52) U.S. Cl.
CPC .............. *C08J 5/18* (2013.01); *B32B 27/304* (2013.01); *C08F 214/22* (2013.01); *C08F 214/26* (2013.01); *H01G 4/18* (2013.01); *H01G 4/186* (2013.01); *B32B 2307/204* (2013.01); *B32B 2457/16* (2013.01); *C08J 2327/16* (2013.01); *C08J 2327/18* (2013.01); *C08K 2201/019* (2013.01); *H01G 4/32* (2013.01); *H01G 4/33* (2013.01); *H01L 41/193* (2013.01); *H01L 41/257* (2013.01); *Y10T 428/3154* (2015.04)

(58) Field of Classification Search
CPC ....... Y10T 428/3154; Y10T 428/31544; B32B 2327/12; B32B 2327/18; B32B 27/30; B32B 27/304; B32B 2307/204; B32B 2457/16; C08J 5/18; C08J 5/00; C08J 2327/12; C08J 2327/14; C08J 2327/16; C08J 2327/18; C08J 2327/20; C08K 2201/019; H01G 4/00; H01G 4/012; H01G 4/018; H01G 4/06; H01G 4/14; H01G 4/18; H01G 4/186; H01G 4/33; Y10S 428/906
USPC .............. 428/421, 422, 906; 361/273, 301.1, 361/311–325, 271
See application file for complete search history.

(56) References Cited

U.S. PATENT DOCUMENTS

| | | | |
|---|---|---|---|
| 4,173,033 A | 10/1979 | Sako et al. | |
| 4,543,294 A | 9/1985 | Sakagami et al. | |
| 5,358,775 A * | 10/1994 | Horn, III | B32B 15/08 428/421 |
| 5,552,210 A * | 9/1996 | Horn, III | C08K 3/22 361/750 |
| 5,965,273 A * | 10/1999 | Walpita | B32B 15/08 361/750 |
| 7,741,396 B2 * | 6/2010 | Tan | H01G 4/206 524/413 |
| 9,455,064 B2 * | 9/2016 | Surendran | H01B 3/12 |

(Continued)

FOREIGN PATENT DOCUMENTS

| | | |
|---|---|---|
| JP | 60-199046 A | 10/1985 |
| JP | 62-286720 A | 12/1987 |

(Continued)

OTHER PUBLICATIONS

Cheng Yang et al., "Effect of coupling agents on the dielectric properties of CaCu₃Ti₄O₁₂/PVDF composites," Composites: Part B, Feb. 22, 2013, pp. 180-186, vol. 50.

(Continued)

*Primary Examiner* — Maria V Ewald
*Assistant Examiner* — Ethan A. Utt
(74) *Attorney, Agent, or Firm* — Sughrue Mion, PLLC

(57) ABSTRACT

The present invention provides a film having excellent heat resistance and a small difference between the permittivity at low temperatures and the permittivity at high temperatures. The present invention provides a film having a relative permittivity of 8 or more at a frequency of 1 kHz at 30° C., wherein the rate of change is −8 to +8% as calculated from a relative permittivity A at a frequency of 1 kHz at 30° C. and a relative permittivity B at a frequency of 1 kHz at 150° C. according to the following formula:

Rate of change(%)=$(B-A)/A \times 100$.

7 Claims, No Drawings

(56) References Cited

U.S. PATENT DOCUMENTS

| | | | |
|---|---|---|---|
| 2007/0117898 A1* | 5/2007 | Tan | H01G 4/206 |
| | | | 524/413 |
| 2010/0110609 A1 | 5/2010 | Koh et al. | |
| 2011/0228442 A1* | 9/2011 | Zhang | H01G 4/18 |
| | | | 361/311 |
| 2013/0188293 A1 | 7/2013 | Koh et al. | |
| 2014/0162065 A1* | 6/2014 | Surendran | B32B 27/20 |
| | | | 428/421 |
| 2015/0368413 A1* | 12/2015 | Tatemichi | C08J 5/18 |
| | | | 359/290 |

FOREIGN PATENT DOCUMENTS

| | | | | |
|---|---|---|---|---|
| JP | 2004-031748 A | 1/2004 | | |
| WO | 2008/090947 A1 | 7/2008 | | |
| WO | 2012/039424 A1 | 3/2012 | | |
| WO | WO-2014061700 A1 * | 4/2014 | | C08J 5/18 |

OTHER PUBLICATIONS

International Search Report of PCT/JP2016/070659 dated Oct. 18, 2016.
International Preliminary Report on Patentability with translation of Written Opinion dated Feb. 1, 2018, issued by the International Searching Authority in application No. PCT/JP2016/070659.
Communication dated Feb. 20, 2019, from the European Patent Office in counterpart European Application No. 16827683.0.
Yadav, et al., "The Effect of Frequency and Temperature on Dielectric Properties of Pure Poly Vinylidene Fluoride (PVDF) Thin Films", vol. III, 2010, XP-002788578 (4 pages total).

* cited by examiner

FILM

CROSS REFERENCE TO RELATED APPLICATIONS

This application is a National Stage of International Application No. PCT/JP2016/070659 filed Jul. 13, 2016, claiming priority based on Japanese Patent Application No. 2015-143107 filed Jul. 17, 2015, the contents of all of which are incorporated herein by reference in their entirety.

TECHNICAL FIELD

The present invention relates to films.

BACKGROUND ART

Films of a homopolymer of vinylidene fluoride and films of a copolymer of vinylidene fluoride and another monomer are known to have a high permittivity.

Patent Literature 1, for example, discloses a film having excellent dielectric characteristics, which can be formed from a vinylidene fluoride resin composition containing 95 to 30% by weight of a vinylidene fluoride resin and 5 to 70% by weight of polyether.

Patent Literature 2 discloses a high dielectric film formed from a fluororesin containing a total of 95 mol % or more of a vinylidene fluoride unit and a tetrafluoroethylene unit.

Patent Literature 3 discloses a film for film capacitors, wherein the film contains, as a film-forming resin, tetrafluoroethylene resin containing a vinylidene fluoride unit and a tetrafluoroethylene unit at a mol % ratio in the range from 0/100 to 49/51 (vinylidene fluoride unit/tetrafluoroethylene unit).

CITATION LIST

Patent Literatures

Patent Literature 1: JP S60-199046 A
Patent Literature 2: WO 2008/090947
Patent Literature 3: WO 2012/039424

SUMMARY OF INVENTION

Technical Problem

A common assumption for conventional films is that the ambient temperature during use is 100° C. at the highest. For example, according to Patent Literature 1, the permittivity was measured at 80° C., and according to Patent Literature 3, the permittivity was measured at 90° C. The permittivity at temperatures higher than the temperatures mentioned above is nowhere mentioned.

The present inventors extensively examined films that can be used at high temperatures. As a result, they found that, unfortunately, conventional films have insufficient heat resistance and are thus unable to maintain their shape; and even if they are heat-resistant, the permittivity at high temperatures is significantly higher than the permittivity at low temperatures. Films in which the difference between the permittivity at low temperatures and the permittivity at high temperatures is significant are not suitable for use in equipment whose operating temperature varies significantly. Power semiconductors made from gallium nitride or silicon carbide are the most effective means to achieve energy conservation, and the power semiconductors operate at high temperatures, even at 200° C. or higher. Thus, there is a demand for development of peripheral electronic components and materials having stable high temperature characteristics at 150° C. or higher in order to be operable at higher temperatures than ever before.

In view of the present situation, the present invention aims to provide a film having excellent heat resistance and a small difference between the permittivity at low temperatures and the permittivity at high temperatures.

Solution to Problem

The present invention provides a film having a relative permittivity of 8 or more at a frequency of 1 kHz at 30° C., wherein the rate of change is −8 to +8% as calculated from a relative permittivity A at a frequency of 1 kHz at 30° C. and a relative permittivity B at a frequency of 1 kHz at 150° C. according to the following formula:

$$\text{Rate of change (\%)} = (B-A)/A \times 100.$$

In the film of the present invention, the relative permittivity at a frequency of 1 kHz at 30° C. is preferably 8 to 12.

The film of the present invention preferably contains a polymer.

The film of the present invention preferably contains a fluoropolymer having a melting point of 180° C. or higher.

The film of the present invention preferably contains a fluoropolymer containing a vinylidene fluoride unit.

The film of the present invention preferably has a thickness of 1 to 100 μm.

The film of the present invention can be suitably applicable as a high dielectric film or a piezoelectric film.

The film of the present invention can be suitably used in a film capacitor, an electrowetting device, or a piezoelectric panel.

Advantageous Effects of Invention

Owing to the above structure, the film of the present invention has excellent heat resistance and a small difference between the permittivity at low temperatures and the permittivity at high temperatures.

DESCRIPTION OF EMBODIMENTS

The present invention is described in detail below.

The film of the present invention has a relative permittivity of 8 or more at a frequency of 1 kHz at 30° C. The relative permittivity is preferably 9 or more. The relative permittivity is preferably 50 or less, more preferably 30 or less, still more preferably 20 or less, particularly preferably 12 or less.

The relative permittivity is a value calculated from the following formula: $C = \varepsilon \times \varepsilon_0 \times S/d$ ($\varepsilon_0$ is the permittivity of vacuum), where C is the capacitance measured with an LCR meter, S is the electrode area, and d is the film thickness.

The film of the present invention has a rate of change of −8 to +8% as calculated from a relative permittivity A at a frequency of 1 kHz at 30° C. and a relative permittivity B at a frequency of 1 kHz at 150° C. according to the formula shown below. The rate of change is preferably −7 to +7%, more preferably −6 to +6%. The rate of change may be −2.0% or less and +2.0% or more.

$$\text{Rate of change(\%)} = (B-A)/A \times 100$$

The relative permittivity A and the relative permittivity B are both calculated from the formula: $C = \varepsilon \times \varepsilon_0 \times S/d$ ($\varepsilon_0$ is the permittivity of vacuum), where C is the capacitance measured with an LCR meter, S is the electrode area, and d is the film thickness.

The film of the present invention preferably has a rate of change of −8 to +8% as calculated from a relative permittivity E at a frequency of 1 kHz at 30° C. and a relative permittivity F at a frequency of 100 kHz at 30° C. according to the following formula:

Rate of change(%)=(F−E)/E×100.

The relative permittivity E and the relative permittivity F are both calculated from the formula: $C=\varepsilon \times \varepsilon_0 \times S/d$ ($\varepsilon_0$ is the permittivity of vacuum), where C is the capacitance measured with an LCR meter, S is the electrode area, and d is the film thickness.

The film of the present invention preferably has a dielectric loss tangent of 7% or lower, more preferably 6% or lower, at a frequency of 1 kHz at 150° C.

The dielectric loss tangent is measured with an LCR meter.

The film of the present invention preferably has an elastic modulus of 800 MPa or more, more preferably 900 MPa or more in the machine direction (MD) at 25° C.

The elastic modulus can be measured in conformity with ASTM D1708.

The film of the present invention preferably has a thickness of 100 µm or less, more preferably 30 µm or less, still more preferably 10 µm or less. The film thickness may be 1 µm or more.

The film thickness can be measured with a digital thickness meter (MF-1001 available from Sendai Nikon Corporation).

The film of the present invention may have an elastic modulus of 800 MPa or more in the machine direction (MD) at 25° C. and a thickness of 100 µm or less. The elastic modulus is more preferably 900 MPa or more. The film thickness is more preferably 30 µm or less, still more preferably 10 µm or less, while it is preferably 1 µm or more.

The film of the present invention preferably has a crystallinity of 50% or higher, more preferably 55% or higher. The upper limit is not particularly limited, and may be 90%.

The crystallinity can be measured with an X-ray diffractometer (Ultima III available from Rigaku Corporation).

The film of the present invention preferably contains a polymer, more preferably a fluoropolymer. The film of the present invention may be an organic film.

The fluoropolymer is preferably a fluoropolymer containing a vinylidene fluoride unit, more preferably a vinylidene fluoride/tetrafluoroethylene copolymer, because the resulting film exhibits higher heat resistance and a smaller difference between the permittivity at low temperatures and the permittivity at high temperatures.

The fluoropolymer preferably has a melting point of 180° C. or higher. The upper limit thereof may be 290° C. A more preferred lower limit is 190° C., and a more preferred upper limit is 280° C.

The fluoropolymer preferably contains a vinylidene fluoride unit in an amount of 10 to 49 mol %, more preferably 20 to 45 mol %, of all the copolymerized units.

The copolymer preferably has a molar ratio of the vinylidene fluoride unit to the tetrafluoroethylene unit of 10/90 to 49/51, more preferably 20/80 to 45/55, so that the heat resistance is further improved, and the difference between the permittivity at low temperatures and the permittivity at high temperatures is further reduced.

The copolymer preferably further contains a copolymerized unit of an ethylenically unsaturated monomer (excluding tetrafluoroethylene and vinylidene fluoride).

The ethylenically unsaturated monomer is not particularly limited as long as it is a monomer copolymerizable with tetrafluoroethylene and vinylidene fluoride. Yet, it is preferably at least one selected from the group consisting of ethylenically unsaturated monomers represented by the following formulae (1) and (2).

$$CX^1X^2=CX^3(CF_2)_nX^4 \qquad \text{Formula (1)}$$

wherein $X^1$, $X^2$, $X^3$, and $X^4$ are the same or different from each other, and are each H, F, or Cl; and n is an integer of 0 to 8, excluding tetrafluoroethylene and vinylidene fluoride.

$$CF_2=CF-ORf^1 \qquad \text{Formula (2)}$$

wherein $Rf^1$ is a C1-C3 alkyl group or a C1-C3 fluoroalkyl group.

Preferred among the ethylenically unsaturated monomers represented by the formula (1) is at least one selected from the group consisting of $CF_2=CFCl$, $CF_2=CFCF_3$, those represented by the following formula (3):

$$CH_2=CF-(CF_2)_nX^4 \qquad (3)$$

wherein $X^4$ and n are as defined above, and those represented by the following formula (4):

$$CH_2=CH-(CF_2)_nX^4 \qquad (4)$$

wherein $X^4$ and n are as defined above. More preferred is at least one selected from the group consisting of $CF_2=CFCl$, $CH_2=CFCF_3$, $CH_2=CH-C_4F_9$, $CH_2=CH-C_6F_{13}$, $CH_2=CF-C_3F_6H$, and $CF_2=CFCF_3$. Still more preferred is at least one selected from the group consisting of $CF_2=CFCl$, $CH_2=CH-C_6F_{13}$, and $CH_2=CFCF_3$.

Preferred among the ethylenically unsaturated monomers represented by the formula (2) is at least one selected from the group consisting of $CF_2=CF-OCF_3$, $CF_2=CF-OCF_2CF_3$, and $CF_2=CF-OCF_2CF_2CF_3$.

The copolymer is preferably a copolymer containing
55.0 to 90.0 mol % of a copolymerized unit of tetrafluoroethylene,
5.0 to 44.9 mol % of a copolymerized unit of vinylidene fluoride, and
0.1 to 10.0 mol % of a copolymerized unit of an ethylenically unsaturated monomer represented by the formula (1):

$$CX^1X^2=CX^3(CF_2)_nX^4 \qquad (1)$$

wherein $X^1$, $X^2$, $X^3$, and $X^4$ are the same or different from each other, and are each H, F, or Cl; and n is an integer of 0 to 8, excluding tetrafluoroethylene and vinylidene fluoride.

The copolymer is more preferably a copolymer containing
55.0 to 85.0 mol % of a copolymerized unit of tetrafluoroethylene,
10.0 to 44.9 mol % of a copolymerized unit of vinylidene fluoride, and
0.1 to 5.0 mol % of a copolymerized unit of an ethylenically unsaturated monomer represented by the formula (1).

The copolymer is still more preferably a copolymer containing
55.0 to 85.0 mol % of a copolymerized unit of tetrafluoroethylene,
13.0 to 44.9 mol % of a copolymerized unit of vinylidene fluoride, and
0.1 to 2.0 mol % of a copolymerized unit of an ethylenically unsaturated monomer represented by the formula (1).

Preferred among the ethylenically unsaturated monomers represented by the formula (1) for improving the mechanical strength of the copolymer at high temperatures and low temperatures is at least one monomer selected from the group consisting of $CH_2=CH-C_4F_9$, $CH_2=CH-C_6F_{13}$, and $CH_2=CF-C_3F_6H$. More preferred is a copolymer containing 55.0 to 80.0 mol % of a copolymerized unit of tetrafluoroethylene, 19.5 to 44.9 mol % of a copolymerized unit of vinylidene fluoride, and 0.1 to 0.6 mol % of a copolymerized unit of an ethylenically unsaturated monomer represented by the formula (1), in which the ethylenically unsaturated monomer represented by the formula (1) is at least one selected from the group consisting of $CH_2=CH-C_4F_9$, $CH_2=CH-C_6F_{13}$, and $CH_2=CF-C_3F_6H$.

The copolymer may be a copolymer containing 58.0 to 85.0 mol % of a copolymerized unit of tetrafluoroethylene, 10.0 to 41.9 mol % of a copolymerized unit of vinylidene fluoride, and 0.1 to 5.0 mol % of a copolymerized unit of an ethylenically unsaturated monomer represented by the formula (1).

The copolymer is also preferably a copolymer containing 55.0 to 90.0 mol % of a copolymerized unit of tetrafluoroethylene, 9.2 to 44.2 mol % of a copolymerized unit of vinylidene fluoride, and 0.1 to 0.8 mol % of a copolymerized unit of an ethylenically unsaturated monomer represented by the formula (2):

$$CF_2=CF-ORf^1 \qquad (2)$$

wherein $Rf^1$ is a C1-C3 alkyl group or a C1-C3 fluoroalkyl group.

The copolymer is more preferably a copolymer containing 58.0 to 85.0 mol % of a copolymerized unit of tetrafluoroethylene, 14.5 to 39.9 mol % of a copolymerized unit of vinylidene fluoride, and 0.1 to 0.5 mol % of a copolymerized unit of an ethylenically unsaturated monomer represented by the formula (2).

The copolymer is also preferably a copolymer containing 55.0 to 90.0 mol % of a copolymerized unit of tetrafluoroethylene, 5.0 to 44.8 mol % of a copolymerized unit of vinylidene fluoride, 0.1 to 10.0 mol % of a copolymerized unit of an ethylenically unsaturated monomer represented by the formula (1), and 0.1 to 0.8 mol % of a copolymerized unit of an ethylenically unsaturated monomer represented by the formula (2).

The copolymer is more preferably a copolymer containing 55.0 to 85.0 mol % of a copolymerized unit of tetrafluoroethylene, 9.5 to 44.8 mol % of a copolymerized unit of vinylidene fluoride, 0.1 to 5.0 mol % of a copolymerized unit of an ethylenically unsaturated monomer represented by the formula (1), and 0.1 to 0.5 mol % of a copolymerized unit of an ethylenically unsaturated monomer represented by the formula (2).

The copolymer is still more preferably a polymer containing 55.0 to 80.0 mol % of a copolymerized unit of tetrafluoroethylene, 19.8 to 44.8 mol % of a copolymerized unit of vinylidene fluoride, 0.1 to 2.0 mol % of a copolymerized unit of an ethylenically unsaturated monomer represented by the formula (1), and 0.1 to 0.3 mol % of a copolymerized unit of an ethylenically unsaturated monomer represented by the formula (2). The copolymer having such a composition is particularly excellent in low permeability.

The copolymer may also be a copolymer containing 58.0 to 85.0 mol % of a copolymerized unit of tetrafluoroethylene, 9.5 to 39.8 mol % of a copolymerized unit of vinylidene fluoride, 0.1 to 5.0 mol % of a copolymerized unit of an ethylenically unsaturated monomer represented by the formula (1), and 0.1 to 0.5 mol % of a copolymerized unit of an ethylenically unsaturated monomer represented by the formula (2).

The copolymer preferably has a melt flow rate (MFR) of 0.1 to 100 g/10 min, more preferably 0.1 to 50 g/10 min.

The MFR refers to the mass (g/10 min) of a polymer that flows out of a nozzle (inner diameter: 2 mm, length: 8 mm) per 10 minutes at 297° C. and a 5-kg load, which can be measured using a melt indexer (Toyo Seiki Seisaku-sho, Ltd.) in conformity with ASTM D3307-01.

The copolymer preferably has a melting point of 180° C. or higher. The upper limit thereof may be 290° C. A more preferred lower limit is 190° C., and a more preferred upper limit is 280° C.

The melting point refers to the temperature corresponding to the peak on an endothermic curve obtained by thermal analysis at a temperature-increasing rate of 10° C./min using a differential scanning calorimeter RDC220 (Seiko Instruments Inc.) in conformity with ASTM D-4591.

The copolymer preferably has a pyrolysis starting temperature (1% mass reduction temperature) of 360° C. or higher. A more preferred lower limit is 370° C. The upper limit of the pyrolysis starting temperature may be 410° C., for example, as long as it falls within the above range.

The pyrolysis starting temperature refers to the temperature at which 1 mass % of a copolymer subjected to a heating test is decomposed, and it is a value obtainable by measuring the temperature at which the mass of the copolymer subjected to the heating test is reduced by 1 mass %, using a thermogravimetric/differential thermal analyzer (TG-DTA).

The copolymer preferably has a storage elastic modulus (E') at 170° C. of 60 to 400 MPa as measured by dynamic viscoelasticity analysis.

The storage elastic modulus is a value measured at 170° C. by dynamic viscoelasticity analysis. More Specifically, the storage elastic modulus is a value measured on a sample having a length of 30 mm, width of 5 mm, and thickness of 0.25 mm, using a dynamic viscoelasticity analyzer DVA220 (IT Keisoku Seigyo Co., Ltd.) in a tensile mode with a clamp width of 20 mm and at a measurement temperature of 25° C. to 250° C., a temperature-increasing rate of 2° C./min, and a frequency of 1 Hz. The storage elastic modulus (E') at 170° C. is more preferably 80 to 350 MPa, still more preferably 100 to 350 MPa.

Test samples may be prepared by, for example, setting the molding temperature to a temperature higher than the melting point of the copolymer by 50° C. to 100° C. to obtain a film having a thickness of 0.25 mm under a pressure of 3 MPa, and cutting the film into pieces of 30 mm length and 5 mm width.

The copolymer may be a fluororesin.

The film of the present invention may further contain an additional polymer, in the case where the film contains the fluoropolymer or the copolymer. Preferred examples of the additional polymer include polycarbonate (PC), polyester, polyethylene terephthalate (PET), polyethylene naphthalate (PEN), silicone resin, polyether, polyvinyl acetate, polyethylene, and polypropylene (PP) for improving the flexibility; polyvinylidene fluoride (PVdF), vinylidene fluoride (VdF)/hexafluoropropylene (HFP) copolymers, poly(meth)acrylate, epoxy resin, polyethylene oxide, polypropylene oxide, polyphenylene oxide (PPO), polyphenylene sulfide (PPS), polyamide (PA), polyimide (PI), polyamideimide (PAI), PC, polystyrene, and polybenzimidazole (PBI) for increasing the strength; and odd polyamide, cyano pullulan, and copper phthalocyanine polymers for supplementing high dielectric properties.

Preferred among these additional polymers to be used in combination with the copolymer is at least one polymer selected from the group consisting of PVdF, VdF/HFP copolymers, poly(meth)acrylate, and polyvinyl acetate, because these compounds have a high affinity to the copolymer. PVdF and VdF/HFP copolymers are particularly preferred for improving the mechanical strength without reducing the permittivity. Poly(meth)acrylate and polyvinyl acetate are particularly preferred for improving the mechanical strength and insulation resistance.

The mass ratio of the copolymer to the additional polymer(s) is preferably 50/50 to 99/1, more preferably 75/25 to 99/1.

The film of the present invention can also contain silica for enabling prevention of blocking of the film without reducing the mechanical strength of the film. The silica content is preferably 0.01 to 10 parts by mass, more preferably 0.1 to 5 parts by mass, relative to 100 parts by mass of the polymer. It is still more preferably 2 parts by mass or less.

The film of the present invention may contain high dielectric inorganic particles, a reinforcing filler, an affinity improver, and the like.

Examples of the high dielectric inorganic particles include barium titanate oxide particles and strontium titanate oxide particles. The amount of the high dielectric inorganic particles is preferably 10 to 200 parts by mass relative to 100 parts by mass of the polymer.

While the presence of the barium titanate oxide particles improves the permittivity, it increases the dielectric loss and decreases the withstand voltage. Thus, the upper limit of the amount of the barium titanate oxide particles is about 200 parts by mass relative to 100 parts by mass of the polymer. In addition, the amount of barium titanate oxide particles is preferably 10 parts by mass or more for improving the permittivity.

While the presence of the strontium titanate oxide particles advantageously improves the permittivity and decreases the dielectric loss, it decreases the withstand voltage. Thus, it is better not to add the strontium titanate oxide particles when a higher withstand voltage is required.

Examples of the reinforcing filler include particles or fibers of silicon carbide, silicon nitride, magnesium oxide, potassium titanate, glass, alumina, and boron compounds.

Examples of the affinity improver include coupling agents, functional group-modified polyolefin, styrene-modified polyolefin, functional group-modified polystyrene, polyacrylate imide, and cumyl phenol. The affinity improver can be added in an amount that does not impair the effect of the present invention. In terms of withstand voltage, it is better not to add these components.

The film of the present invention can be more suitably produced by a production method described later.

The present invention also relates to a method for producing the film described above, the method including a step of melt extruding a polymer into a film and a step of uniaxial stretching the film into a stretched film.

Owing to the above structure, the production method can produce a film having excellent heat resistance and a small difference between the permittivity at low temperatures and the permittivity at high temperatures. The production method can also produce a thin film having a low dielectric loss tangent at high temperatures and a high elastic modulus.

The melt extrusion can be carried out at 250° C. to 380° C.

The melt extrusion can be carried out using a melt extruder. The cylinder temperature is preferably set at 250° C. to 350° C., and the die temperature is preferably set at 300° C. to 380° C.

Preferably, the production method may also include a step of winding the film obtained by the extrusion on a roll. The roll temperature is preferably set at 120° to 180° C.

The film obtained by the extrusion is uniaxially stretched into a stretched film. The film is uniaxially stretched in the machine direction (MD) that is the same as the direction in which in which the polymer is extruded.

The stretch ratio in the uniaxial stretching is preferably 2 to 6 times. It is more preferably 3 times or more, and it is more preferably 5 times or less.

The stretching temperature in the uniaxial stretching is preferably 100° C. to 250° C. It is more preferably 110° C. or higher, and it is more preferably 200° C. or lower.

The stretching speed in the uniaxial stretching is preferably 100 to 500 mm/min. It is more preferably 200 mm/min or higher, and it is more preferably 400 mm/min or lower.

Preferably, the production method may further include a step of biaxially stretching the uniaxially stretched film to obtain a stretched film. The film is biaxially stretched in the machine direction (MD) and the transverse direction (TD) perpendicular thereto.

The stretch ratio in the biaxial stretching is preferably 2 to 6 times. It is more preferably 3 times or more, and it is more preferably 5 times or less.

The stretching temperature in the biaxial stretching is preferably 100° C. to 250° C. It is more preferably 110° C. or higher, and it is more preferably 200° C. or lower.

The stretching speed in the biaxial stretching is preferably 100 to 500 mm/min. It is more preferably 200 mm/min or higher, and it is more preferably 400 mm/min or lower.

The production method may also preferably include a step of heat setting the uniaxially or biaxially stretched film obtained. The heat setting can reduce shrinkage of the film due to heat or the like, or can improve the durability.

The heat setting temperature is preferably 100° C. to 250° C. It is more preferably 150° C. or higher, and it is more preferably 200° C. or lower.

The film of the present invention is suitable as a high dielectric film or a piezoelectric film.

In the case of using the film of the present invention as a piezoelectric film, the film is preferably subjected to a polarization treatment. The polarization treatment can be carried out by corona discharge, for example, by applying voltage to the film using a linear electrode or a needle electrode as described in JP 2011-181748 A. The polarization treatment may be followed by heat treatment.

The film of the present invention can also be suitably used in a film capacitor, an electrowetting device, or a piezoelectric panel.

The film of the present invention can be suitably used as a high dielectric film of a film capacitor. The film capacitor may include the film of the present invention and an electrode layer provided on at least one side of the film.

As for the structure of the film capacitor, examples thereof include laminated film capacitors in which electrode layers and high dielectric films are alternately stacked (for example, those disclosed in JP S63-181411 A and JP H03-18113 A) and rolled film capacitors in which a tape-shaped high dielectric film and a tape-shaped electrode layer are rolled up together (for example, one disclosed in JP S60-262414 A in which electrodes are not continuously stacked on a high dielectric film, and one disclosed in JP H03-286514 A in which electrodes are continuously stacked on a high dielectric film). In the case of relatively-easily-producible rolled film capacitors having a simple structure in which electrodes are continuously stacked on a high dielectric film, generally, two high dielectric films each having an electrode stacked on one side thereof are rolled up together in such a manner that the electrodes do not contact each other, and then, if necessary, these films are fixed so as not to be loosened.

The electrode layer is not particularly limited. Generally, it is a conductive metal layer made of aluminum, zinc, gold, platinum, copper, or the like, and is used as metal foil or a deposited metal film. The metal foil and a deposited metal film may be used singly or in combination. Usually, a deposited metal film is preferred because a thin electrode layer can be obtained with the result that the capacity can be increased for its volume, the adhesion to a dielectric film is excellent, and the variation in thickness is small. A deposited metal film is not limited to a single layer, and it may be a multi-layer, if necessary, which can be obtained by, for example, a method for producing an electrode layer by forming a semi-conductive aluminum oxide layer on an aluminum layer for giving moisture resistance (for example, JP H02-250306 A). The thickness of the deposited metal film also is also not particularly limited, and it is preferably in the range from 100 to 2000 angstrom, more preferably in the range from 200 to 1000 angstrom. The thickness of the deposited metal film in this range is suitable because the capacity and strength of the capacitor are balanced.

When the deposited metal film is used as an electrode layer, the film may be formed by any method, such as vacuum deposition method, sputtering method, or ion plating method. Usually, the vacuum deposition method is used.

There are several types of the vacuum deposition method, such as batch type for molded articles, and semi-continuous type and continuous (air to air) type for long-size articles. Currently, the semi-continuous vacuum deposition method is the mainstream. The semi-continuous metal deposition method is a method in which a metal is deposited and coiled in a vacuum system which is then brought back to atmospheric pressure, and the deposited film is taken out.

The semi-continuous metal deposition method can be carried out specifically by the method described with reference to FIG. 1 in Japanese Patent No. 3664342.

In the case of forming a thin metal layer on the film, the film surface may be subjected to a pretreatment such as corona treatment or plasma treatment for improving the adhesion. In the case of using metal foil as an electrode layer, the thickness of the metal foil is not particularly limited, but it is usually in the range from 0.1 to 100 µm, preferably 1 to 50 µm, more preferably 3 to 15 µm.

Fixing may be carried out by any method. For example, a resin may be used for sealing or an insulation case may be used for encapsulation, so that the structure can be fixed and protected at the same time. Also, a lead wire may be connected by any method, such as welding, ultrasonic pressure welding, thermal pressure welding, or fixing with an adhesive tape. The lead wire may be connected to an electrode before rolling up. For example, in the case of encapsulation in an insulation case, if necessary, an opening may be sealed with a thermosetting resin such as urethane resin or epoxy resin to prevent oxidative degradation.

The film of the present invention can be suitably used as a high dielectric film of an electrowetting device.

The electrowetting device may include a first electrode, a second electrode, a conductive liquid movably contained between the first electrode and the second electrode, and the film of the present invention (high dielectric film) disposed between the first electrode and the conductive liquid so as to insulate the first electrode from the second electrode. The film of the present invention may have a water-repellent layer thereon. In addition to the conductive liquid, an insulating liquid may be held between the first electrode and the second electrode, and the conductive liquid and the insulating liquid may together form a bi-layer.

The electrowetting device can be used in optical elements, display devices (displays), varifocal lenses, light modulating devices, optical pickup devices, optical recording/reproducing devices, developing devices, droplet dispensers, and analytical instruments (such as chemical, biochemical, and biological analytical instruments which require movement of a small amount of conductive liquid to analyze samples).

The film of the present invention can be suitably used as a piezoelectric film of a piezoelectric panel.

The piezoelectric panel may include a first electrode, the film of the present invention (piezoelectric film), and a second electrode in the stated order. The first electrode is directly or indirectly disposed on one main side of the film. The second electrode is directly or indirectly disposed on the other main side of the film.

The piezoelectric panel can be used in touch screens. A touch screen can be used in input devices. An input device including the touch screen allows data to be input based on the touch position and/or touch pressure. The input device including the touch screen can include a position sensor and a pressure sensor.

The input device can be used in electronic devices (such as mobile phones (e.g., smartphones), personal digital assistants (PDAs), tablet personal computers, ATMs, automatic ticket vending machines, and automotive navigation systems). An electronic device including the input device can be handled and operated based on the touch position and/or touch pressure.

In addition, the film of the present invention can also be used as a film for environmental power generation (such as vibration power generation) or for ferroelectric devices (such as touch sensors, touch screens, tactile sensors, dielectric bolometers, film speakers, and haptics), and electrostrictive actuators.

EXAMPLES

Next, the present invention is described with reference to examples, but the present invention is not limited to these examples.

Numerical values in the examples were obtained by the following methods.
Monomer Composition of Fluoropolymer The monomer composition was determined by $^{19}$F-NMR at a measurement temperature (melting point of the polymer+20° C.) using a nuclear magnetic resonance device AC300 (Bruker-Biospin). Elemental analyses were appropriately combined for measurement, depending on the integral value of each peak and the type of the monomers.

Melting Point

The melting point was determined from the peak on an endothermic curve obtained by thermal analysis at a temperature-increasing rate of 10° C./min using a differential scanning calorimeter RDC220 (Seiko Instruments Inc.) in conformity with ASTM D-4591.

Melt Flow Rate (MFR)

The MFR was defined as the mass (g/10 min) of a polymer that flows out of a nozzle (inner diameter: 2 mm, length: 8 mm) per 10 minutes at 297° C. and a 5-kg load, which was measured using a melt indexer (Toyo Seiki Seisaku-sho, Ltd.) in conformity with ASTM D3307-01.

Film Thickness

The film placed on a substrate was measured for thickness at room temperature using a digital thickness meter (MF-1001 available from Sendai Nikon Corporation).

Dielectric Loss Tangent and Relative Permittivity

Aluminium was deposited on both sides of the film in vacuo to obtain a sample. The sample was measured for capacitance and dielectric loss tangent at a frequency of 1 kHz to 100 kHz at 30° C. to 150° C. using an LCR meter (ZM2353 available from NF Corporation). The relative permittivity was calculated from the measured capacitance.

Volume Resistivity

The volume resistivity ($\Omega \cdot cm$) was measured at 300 V DC at 90° C. in a dry-air atmosphere using a digital super megohmmeter/microammeter.

Elastic Modulus

The film in strip form was measured for elastic modulus at 500 mm/min using a tensile tester (Autograph AGS-X-Series AGS-100NX available from Shimadzu Corporation).

Crystallinity

Multiple films were superimposed on each other to a thickness of 40 μm or more, and set in a sample holder to be used as a test sample. The crystallinity of the sample was calculated from the ratio of the area of the crystalline region to the area of the amorphous region in the diffraction spectrum obtained in the range from 10° to 40° using an X-ray diffractometer (Ultima III available from Rigaku Corporation).

Example 1

Pelletized resin was extruded at 290° C. to 340° C. in a melt extruder into a film having a thickness of 15 μm. The 15-μm-thick film was stretched to 3.0 times at 160° C. by a uniaxial stretching machine into a stretched film having a thickness of 9 μm.

Example 2

Pelletized resin was extruded at 290° C. to 340° C. in a melt extruder into a film having a thickness of 15 μm. The 15-μm-thick film was stretched to 4.0 times at 160° C. by a uniaxial stretching machine into a stretched film having a thickness of 7 μm.

Example 3

The stretched 7-μm-thick film obtained in Example 2 was heat treated at 160° C. for 30 minutes into a film having a thickness of 7 μm.

Example 4

Pelletized resin was extruded at 290° C. to 340° C. in a melt extruder into a film having a thickness of 15 μm. The 15-μm-thick film was stretched to 4.5 times at 160° C. by a uniaxial stretching machine into a stretched film having a thickness of 6 μm.

Example 5

Pelletized resin was extruded at 290° C. to 340° C. in a melt extruder into a film having a thickness of 15 μm. The 15-μm-thick film was stretched to 2.5 times at 160° C. by a uniaxial stretching machine into a stretched film having a thickness of 10 μm.

Example 6

Pelletized resin was extruded at 290° C. to 340° C. in a melt extruder into a film having a thickness of 50 μm. The 50-μm-thick film was stretched to 3.0 times at 160° C. by a uniaxial stretching machine into a stretched film having a thickness of 28 μm.

Comparative Example 1

Pelletized resin was heat-pressed at 250° C. into a film having a thickness of 100 μm.

Comparative Example 2

A vinylidene fluoride homopolymer (Neoflon VP-825 available from Daikin Industries, Ltd.) was extruded with a melt extruder into a film having a thickness of 25 μm.

TABLE 1

| | | Examples | | | | | | Comparative Examples | |
|---|---|---|---|---|---|---|---|---|---|
| | | 1 | 2 | 3 | 4 | 5 | 6 | 1 | 2 |
| Resin properties | | | | | | | | | |
| (mol %) | VDF | 40.8 | 40.8 | 40.8 | 40.8 | 40.8 | 40.8 | 40.8 | 100 |
| | TFE | 58.9 | 58.9 | 58.9 | 58.9 | 58.9 | 58.9 | 58.9 | — |
| | $CH_2=CHCF_2CF_2CF_2CF_2CF_2CF_3$ | 0.3 | 0.3 | 0.3 | 0.3 | 0.3 | 0.3 | 0.3 | — |
| Melting point (° C.) | | 213 | 213 | 213 | 213 | 213 | 213 | 213 | 177 |
| MFR (g/10 min) | | 2.8 | 2.8 | 2.8 | 2.8 | 2.8 | 2.8 | 2.8 | 1.5 |
| Film thickness (mm) | | 9 | 7 | 7 | 6 | 10 | 28 | 100 | 25 |
| Production method | | Melt extrusion | Melt extrusion | Melt extrusion | Melt extrusion | Melt extrusion | Melt extrusion | Press | Melt extrusion |
| Uniaxial stretching | | 3.0 times | 4.0 times | 4.0 times | 4.5 times | 2.5 times | 3.0 tims | N/A | N/A |
| Heat setting | | N/A | N/A | Heated | N/A | N/A | N/A | N/A | N/A |

TABLE 1-continued

|  |  | Examples | | | | | | Comparative Examples | |
|---|---|---|---|---|---|---|---|---|---|
|  |  | 1 | 2 | 3 | 4 | 5 | 6 | 1 | 2 |
| Film properties | | | | | | | | | |
| Relative permittivity | 1 kHz 30° C. | 10.2 | 11.0 | 10.9 | 10.9 | 9.9 | 10.0 | 8.2 | 10.8 |
|  | 1 kHz 150° C. | 10.6 | 11.4 | 11.5 | 11.5 | 10.4 | 10.5 | 9.3 | 13.0 |
|  | Rate of change (%) | 3.9 | 3.6 | 5.5 | 5.5 | 5.1 | 5.0 | 13.4 | 20.4 |
|  | 100 kHz 30° C. | 9.5 | 10.5 | 10.4 | 10.2 | 9.2 | 9.4 | 7.8 | 10.4 |
|  | Rate of change (%) | −6.9 | −4.5 | −4.6 | −6.4 | −7.1 | −6.0 | −4.9 | −3.7 |
| Dielectric loss tangent | 1 kHz 150° C. (%) | 2.1 | 1.6 | 0.9 | 1.4 | 2.4 | 2.2 | 8.8 | 26.4 |
| Volume resistivity | Ω · cm | 1E+15 | 2E+15 | 2E+15 | 2E+15 | 1E+15 | 1E+15 | 2E+14 | 8E+13 |
| Elastic modulus | MPa | 1280 | 1990 | 1970 | 2270 | 1100 | 1220 | 780 | 900 |
| Crystallinity | % | 58 | 76 | 66 | 79 | 51 | 55 | 48 | 45 |

The invention claimed is:

1. A film having a relative permittivity of 8 or more at a frequency of 1 kHz at 30° C.,
    wherein the rate of change is −8 to +8% as calculated from a relative permittivity A at a frequency of 1 kHz at 30° C. and a relative permittivity B at a frequency of 1 kHz at 150° C. according to the following formula:

Rate of change(%)=($B-A$)/$A$×100, wherein the film comprises a fluoropolymer having a melting point of 180° C. or higher, and
    wherein the film does not contain high dielectric inorganic particles.

2. The film according to claim 1,
    wherein the relative permittivity at a frequency of 1 kHz at 30° C. is 8 to 12.

3. The film according to claim 1, comprising a fluoropolymer containing a vinylidene fluoride unit.

4. The film according to claim 1, wherein the film has a thickness of 1 to 100 μm.

5. The film according to claim 1, wherein the film is a high dielectric film or a piezoelectric film.

6. The film according to claim 1, wherein the film is for use in a film capacitor, an electrowetting device, or a piezoelectric panel.

7. The film according to claim 1, wherein the film does not contain inorganic particles.

\* \* \* \* \*